United States Patent [19]

Tsutsui et al.

[11] Patent Number: 4,883,967
[45] Date of Patent: Nov. 28, 1989

[54] RADIATION DETECTOR AND METHOD OF MANUFACTURING THE SAME

[75] Inventors: Hiroshi Tsutsui, Yawata; Sueki Baba, Suita; Koichi Ohmori, Toyonaka; Tetsuro Ohtsuchi, Osaka; Masanori Watanabe, Katano, all of Japan

[73] Assignee: Matsushita Electric Industrial Co., Ltd., Kadoma, Japan

[21] Appl. No.: 189,816

[22] Filed: May 3, 1988

[30] Foreign Application Priority Data

May 26, 1987 [JP] Japan ................................ 62-127151
Mar. 9, 1988 [JP] Japan ................................ 63-55172

[51] Int. Cl.$^4$ ...................... H01L 27/14; H01L 31/00
[52] U.S. Cl. ............................ 250/370.01; 250/332; 250/338.4; 250/352
[58] Field of Search ................... 250/332, 338.4, 352, 250/353, 370.08, 370.01

[56] References Cited

U.S. PATENT DOCUMENTS

| | | | |
|---|---|---|---|
| 4,675,525 | 6/1987 | Amingual et al. | 250/338.4 |
| 4,754,139 | 6/1988 | Ennulat et al. | 250/332 |
| 4,783,594 | 11/1988 | Schulte et al. | 250/370.08 |

FOREIGN PATENT DOCUMENTS

| | | | |
|---|---|---|---|
| 2537277 | 6/1984 | France | 356/51 |
| 57-146123 | 9/1982 | Japan | 250/370.08 |

Primary Examiner—Constantine Hannaher
Attorney, Agent, or Firm—Spencer & Frank

[57] ABSTRACT

Disclosed are a radiation detector and a method of manufacturing the same. The radiation detector includes a radiation screening member for cutting off radiation incident upon the marginal portions of the radiation incident surface of a semiconductor radiation sensor or a semiconductor radiation sensor array for outputting pulses in correspondence with radiation photons, as well as upon the boundary portions between adjacent sensors. In order to manufacture such a radiation detector, leads are provided by the wire bonding, soldering or bump contacting on the radiation screening member, and at least part of the radiation screening member is then fitted to the semiconductor radiation sensor or the semiconductor radiation sensor array so as to make it electrically connected to the electrodes of the semiconductor radiation sensor or the semiconductor radiation sensor array.

16 Claims, 8 Drawing Sheets

RADIATION DETECTOR AND METHOD OF MANUFACTURING THE SAME

BACKGROUND OF THE INVENTION

1. Field of the Invention:

The present invention relates to a radiation detector which employs a very small radiation sensor capable of conducting a radiation energy spectrum analysis or a very small radiation sensor array for use in X-ray diagnostic equipment or a nondestructive inspection device, as well as to a method of manufacturing such a radiation detector.

2. Description of the Prior Art:

FIG. 10 shows the absorption mechanism in the photoelectric effect of radiation. When radiation 51 is incident upon an atom 52, of the various types of orbital electrons, the K-shell electron 53 is the one which mainly absorbs the radiation 51. After absorbing the radiation, the K-shell electron moves outward from its orbit as an excited electron 54. This generates a pair consisting of several electrons and holes in a semiconductor, and a number of photons of radiation can be detected by counting the current or voltage pulses generated by the electron-hole pairs. An electron with an orbit outward of the K-shell moves into the orbit of the K-shell to make up for the K-shell electron 53. When an electron in an outer orbit enters the K-shell, energy which represents the difference in orbital energies is emitted as a K-shell characterized X-ray 56.

FIG. 11 shows this phenomenon taking place in a semiconductor radiation sensor. The semiconductor radiation sensor shown in FIG. 11 is of an all depletion layer type. As radiation is absorbed within a semiconductor radiation sensor 55, an excited electron 54 and a K-shell characterized X-ray 56 are generated. The excited electron 54 loses most of its energy within the semiconductor crystal. However, when the K-shell characterized X-ray 56 is generated in the vicinity of the surface of the crystal, it is often caused to escape from the crystal. This phenomenon is called a K-shell characterized X-ray escape 57. When this occurs, the charges generated in a detector are reduced, reducing the height of the detector output pulses. FIG. 12 indicates this phenomenon using the output pulse height. A reference numeral 58 in FIG. 11 denotes an electrode of the semiconductor radiation sensor. FIG. 12a shows the number of photons with respect to the energy of the incident radiation. FIG. 12b shows the actually obtained distribution of the height of pulses output from the semiconductor radiation sensor when radiation having a one-component energy E is incident thereon. In an actual measurement, the output pulse is divided into two pulse groups: one having a height corresponding to the incident energy E and the other having a height corresponding to the energy E−Ei (where Ei is the bound energy of the K-shell electron).

Thus, when the incident one-component radiation energy generates two energy groups respectively represented by a pulse group having a height corresponding to the incident radiation energy and a pulse group caused by the K-shell characterized X-ray escape and having a height corresponding to an energy lower than the incident radiation energy, errors occur when the energy of a plurality of X-rays is to be measured. Further, the K-shell characterized X-ray may cross the boundaries between adjacent sensors in a sensor array and be incident upon adjacent sensors, causing signal cross talk.

SUMMARY OF THE INVENTION

In view of the above-described problems of the prior art, an object of the present invention is to provide a radiation detector capable of reducing the number of K-shell characterized X-rays that are generated by the photoelectric effect and that escape to the outside of a semiconductor radiation sensor, enabling them to be absorbed within the semiconductor radiation sensor.

Another object of the present invention is to provide a method of manufacturing the above-described radiation detector.

To this end, the present invention provides, in one of its aspects, a radiation detector which includes a radiation screening plate for screening the radiation incident upon the surface of a semiconductor radiation sensor except for part thereof so that the incident X-rays can be absorbed by the central portion of the sensor so as to enable the resultant K-shell characterized X-rays to be absorbed within the semiconductor radiation sensor before they reach the side surfaces of the sensor or the boundaries between adjacent sensors.

The present invention provides, in another of its aspects, a method of manufacturing the above-described radiation detector which comprises the steps of: providing leads which lead to an external circuit by the wire bonding, soldering or bump contact method on a radiation screening plate for cutting off radiation incident upon the radiation incident side end surface portion of a semiconductor radiation sensor or a semiconductor radiation sensor array and the boundary portions between adjacent sensors, and then fitting the radiation screening plate with the semiconductor radiation sensor or the semiconductor radiation sensor array in part so as to enable the electrodes of the semiconductor radiation sensor or the semiconductor radiation sensor array to be electrically connected to the radiation screening member.

In the present invention, since a large part of K-shell characterized X-rays generated within the semiconductor radiation sensor are absorbed within the semiconductor radiation sensor, an output pulse height distribution is made corresponded to the incident energy, and the signal components generated by the K-shell characterized X-rays escape can be reduced.

DESCRIPTION OF THE PREFERRED EMBODIMENTS

Figure 1:
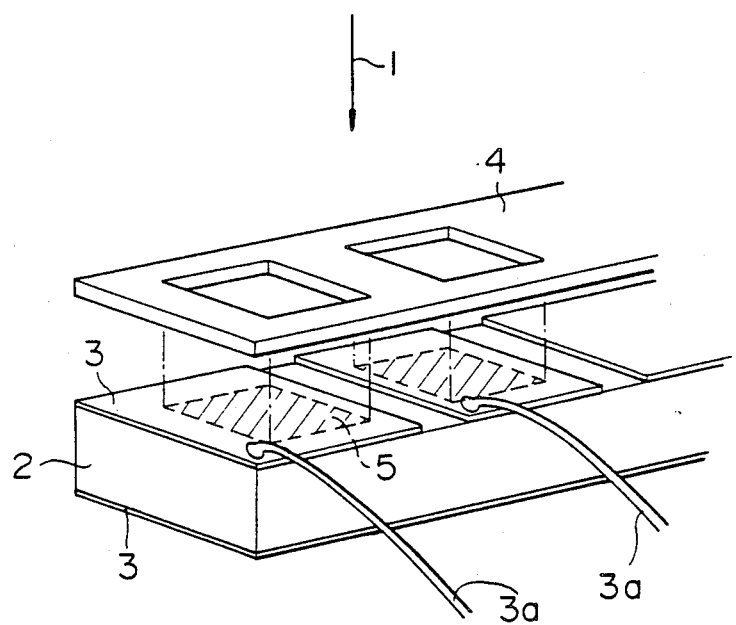
FIG. 1 is a schematic view of a first embodiment of the present invention.

Embodiments of the present invention will be described with reference to the accompanying drawings. FIG. 1 is a schematic view of a first embodiment of the present invention. In order to intercept radiation 1 which is incident upon a multichannel radiation sensor array 2 from above as viewed in FIG. 1, a screening member 4 is provided on a split electrode of electrodes 3, having leads 30 disposed on the two surfaces of the sensor array, i.e., on the electrode provided on the X-ray incident side surface of the sensor array. A part of the incident X-ray 1 is cut off by the radiation screening member 4, and the remaining part is made incident only upon each of hatched X-ray sensing areas 5 shown in FIG. 1. In other words, the peripheral portion of the sensor and the boundary portions thereof which are located close to adjacent sensors are shielded against the radiation by the radiation screening member 4.

Figure 2:
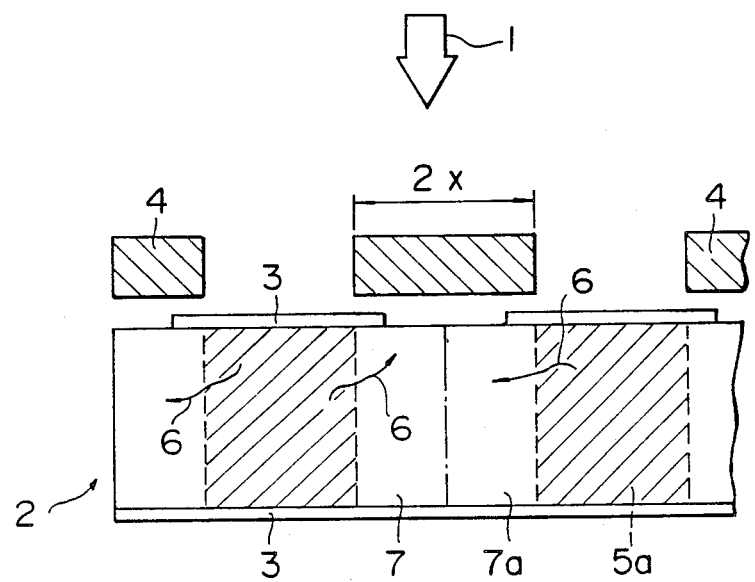
FIG. 2 is a cross-sectional view of the first embodiment of FIG. 1.

FIG. 2 is a cross-sectional view of the structure shown in FIG. 1. The incident radiation 1 is cut off by the radiation screening member 4, and is made incident upon a hatched X-ray sensing volume 5a. As the X-ray is absorbed within the X-ray sensing volume 5a, K-shell characterized X-rays 6 are generated, and a part of the X-rays 6 moves out of the hatched X-ray sensing volume 5a, as shown in FIG. 2. However, since the portion of the sensor shielded by the radiation screening member 4 is capable of sensing radiation, like the X-ray sensing volume 5a, a large part of the K-shell characterized X-rays 6 is absorbed within the sensor (1) 7, so long as the width 2x of the screening member has a suitable value, making it possible for the sensor (1) 7 to output pulses whose height is not affected by the K-shell characterized X-ray escape. Similarly, a large part of the K-shell characterized X-rays 6 generated within an adjacent sensor (2) 7a is absorbed within the sensor (2) 7a. The above-described condition is satisfied if x is larger than that of the half-value layer for the K-shell characterized X-ray photon energy. In other words, the influence of the K-shell characterized X-rays in the adjacent sensors can be reduced if the following equation is satisfied:

where

Figure 3:
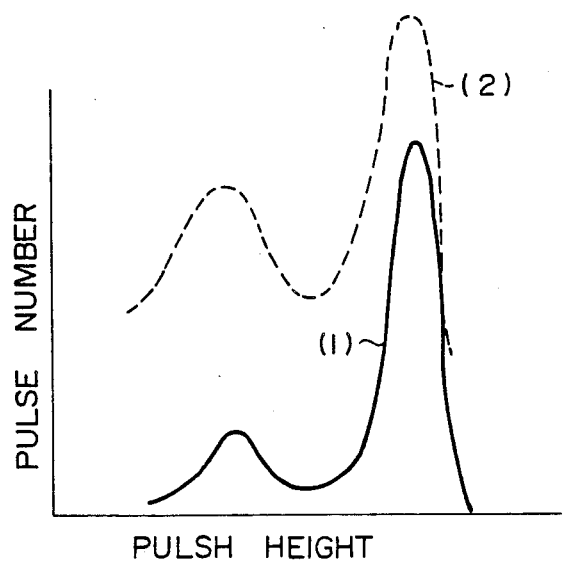
FIG. 3 is a graph showing changes in a pulse height distribution generated with a screening plate provided in a sensor and without it.

I: intensity of radiation transmitting through the sensor $I_O$: intensity of radiation incident upon the sensor $\mu(E)$: coefficient of photoelectric absorption E: K-shell characterized X-ray photon energy FIG. 3 shows the result of an actual measurement of radiation with a sensor provided with a radiation screening member. The crystal of the radiation sensor array was made of cadmium telluride (CdTe). Each sensor had an area of 1 mm², and the radiation screening member was made of a tungsten sheet having a thickness of 1 mm. The length of x was 100 μm. The radiation of 59.54 KeV γ rays of $^{241}$Am was used. The graph (2) in FIG. 3 represents the pulse height distribution obtained using a sensor without the radiation screening member, and the graph (1) represents that obtained by a sensor with the radiation screening member. As is clear from FIG. 3, although the number of output pulses decreased owing to the provision of the radiation screening member, the lower pulse height peak, i.e., the pulse peak generated by the K-shell characterized X-ray escape was reduced. The residual lower pulse height peak was generated by the K-shell characterized X-rays emitted through the electrode.

In the above-described embodiment, the split electrode is disposed on the side of the sensor array upon which the X-ray is incident However, it may be provided on the side opposite to the radiation incident side. In that case, the same radiation screening member made of a metal as used in the first embodiment is used, and the common electrode of the semiconductor radiation sensor or the semiconductor radiation sensor array is electrically connected to the radiation screening member so as to enable voltage to be applied to the sensor or sensor array through the radiation screening member.

Further, the leads through which radiation signals are taken out from the split electrode may be connected by wire bonding. However, if the semiconductor radiation sensor is made of a compound semiconductor having a low hardness, the characteristics thereof are easily deteriorated by the applied pressure. Therefore, another example of packaging the sensor array which is described below is provided so as to obviate the above-described problem.

Figure 4A:
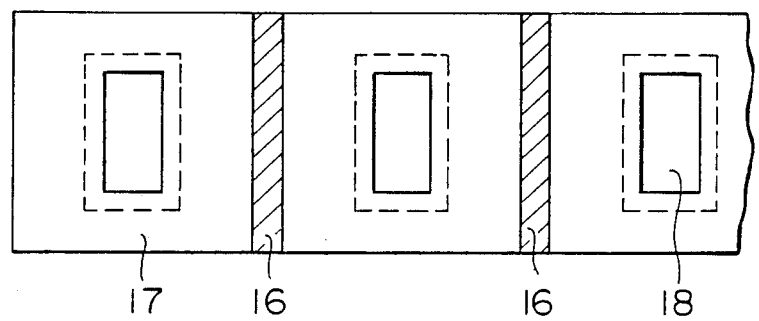
FIGS. 4a and 4b are plan and cross-sectional views of a radiation screening member employed in a semiconductor radiation detector, showing a second embodiment of the present invention.
Figure 4B:
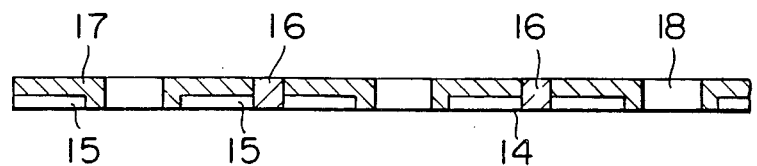

FIGS. 4A and 4B show the structure of a radiation screening member employed in the second embodiment. A radiation screening member 14 includes an insulator 15 disposed adjacent to the semiconductor radiation sensor array, an insulator 16 for separating adjacent sensors, and a radiation screening plate 17. The radiation screening plate 17 is made of tungsten having an atomic number of 74 and a high electric conductivity. The provision of the thus-arranged radiation screening member 14 allows only the radiation incident upon openings 18 to reach the semiconductor radiation sensor array.

Wires for connecting the radiation screening plates 17 to an external circuit are attached to the radiation screening plates 17 by wire bonding. Wire bonding is conducted before the radiation screening member is bonded to the semiconductor radiation sensor array so as to enable the adverse effects of the pressure applied to the semiconductor radiation sensor such as generation of cracks to be eliminated.

Figure 5:
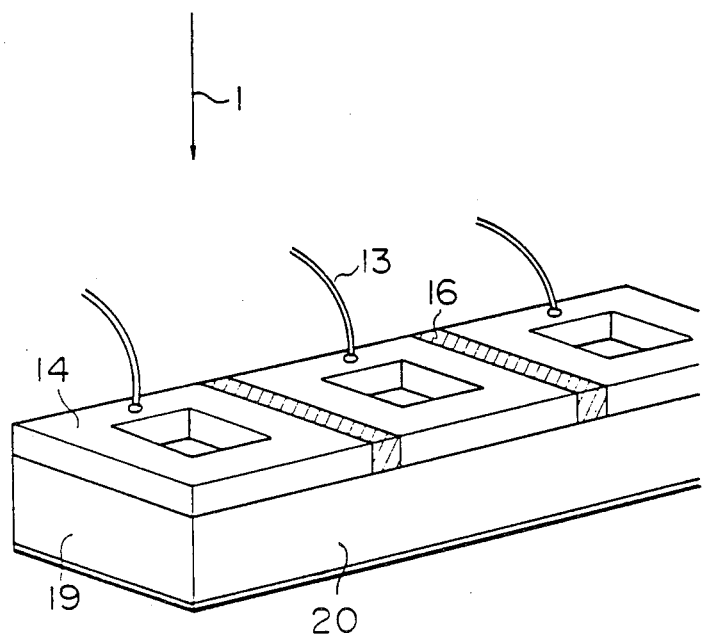
FIG. 5 is a perspective view of a semiconductor radiation detector of FIGS. 4a and 4b.

FIG. 5 is a perspective view of a radiation detector of this embodiment. The radiation screening member 14 having a structure shown in FIGS. 4a and 4b is fixed to a semiconductor radiation sensor array 19 by an insulating adhesive of the type which sets at normal temperatures, in such a manner that the openings 18 of the radiation screening member are aligned with the electrodes of the semiconductor radiation sensor array 19. At that time, a conductive portion, i.e., the radiation screening plate 17, surrounding each of the openings of the radiation screening member 14 is brought into contact with each of the electrodes of the radiation sensor array so as to enable the charges generated within the semiconductor radiation sensor to be moved to the radiation screening member 14. The charges which have been moved to the radiation screening member 14 are led to an external circuit through wires 13 which have been connected to the radiation screening member 14 beforehand.

In a radiation detector arranged in the above-described manner, K-shell characterized X-rays escape and cross talk between the adjacent channels can be eliminated, and excellent resolution for energy can be provided. Also, packaging can be done easily.

Figure 6:
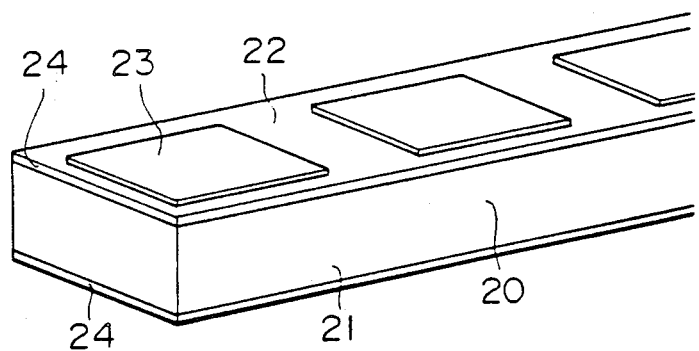
FIG. 6 is a perspective view of a semiconductor radiation sensor, showing a third embodiment of the present invention.

A third embodiment of the present invention is described below. FIG. 6 is a perspective view of a semiconductor radiation sensor array 20 employed in this embodiment. After electrodes 24 are formed on the two surfaces of a CdTe crystal 21, a $SiO_2$ film 22 is formed on the surface of the electrode 24 disposed on one surface of the crystal 21. Thereafter, an Al film 23 is deposited on the electrode, and the deposited Al film is then formed into a pattern, as shown in FIG. 6. The $SiO_2$ film 22 is formed by depositing $SiO_2$ by the plasma CVD method and then by forming it into a predetermined pattern by photolithography. The Al film 23 is formed by vacuum depositing the Al by electron beam heating and then by forming it into a predetermined pattern by photolithography. The $SiO_2$ film has a thickness of 100 to 5,000 Å, which is enough to prevent breakage of the Al. The thickness of the Al film is larger than that of the $SiO_2$ film.

Figure 7A:
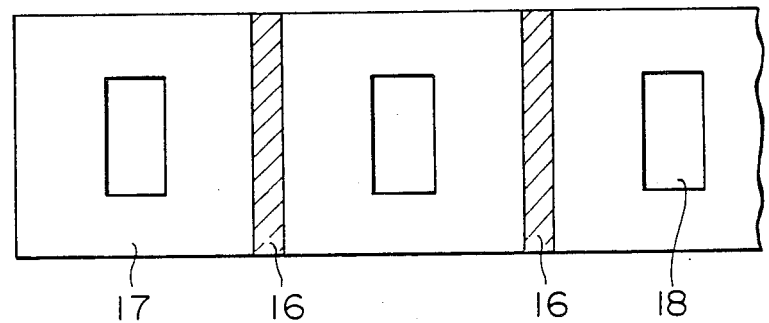
FIGS. 7a and 7b are plan and cross-sectional views of a radiation screening member employed in a semiconductor radiation sensor of FIG. 6.
Figure 7B:
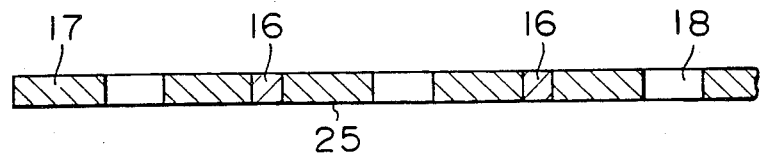
Figure 8:
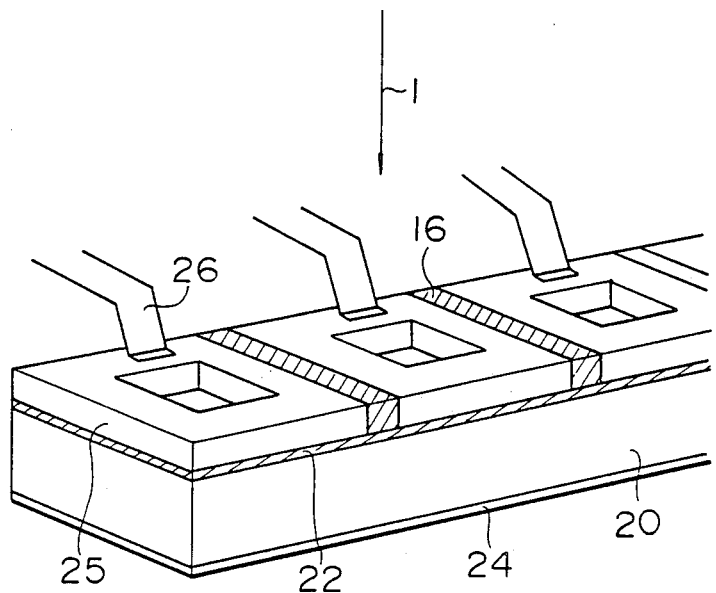
FIG. 8 is a perspective view of the semiconductor radiation sensor of FIGS. 7a and 7b.

In order to manufacture a radiation detector such as that shown in FIG. 8, a radiation screening member having a structure shown in FIGS. 7a and 7b is attached to the surface of the above-described semiconductor radiation sensor array by an adhesive attached to the marginal portions of the radiation screening member. A radiation screening member 25 is composed of insulators 16 for insulating channels from adjacent channels and radiation screening plates 17 made of tungsten, the insulators and the radiation screening plates being alternately disposed at a predetermined pitch. The size of each of openings 18 of the radiation screening plates 17 made of tungsten is made smaller than that of each of the Al film patterns so as to ensure that the radiation screening member makes contact with the Al film 23 formed on the semiconductor radiation sensor and thereby provide conduction therebetween.

Next, leads 26 that are connected to an external circuit are connected by the bump contact method to tungsten that forms the radiation screening plates at positions corresponding to the channels, as shown in FIG. 8.

In the above-described manufacturing method, the electrodes of the semiconductor radiation sensor array are easily, with a high degree of accuracy, aligned with the openings of the radiation screening member. Further, since the $SiO_2$ film is formed on the surface of the semiconductor radiation sensor, it is not necessary that an insulator is provided on the surface of the radiation screening member which faces the semiconductor radiation sensor array, thereby simplifying the structure of the radiation screening member. In the present embodiment, it is therefore possible to provide a radiation detector having a small degree of K-shell characterized X-ray escape, no cross talk that occurs between the adjacent channels, and an excellent energy distribution.

In this embodiment, a high-resistance thin film of $Si_3N_4$, $Ta_2O_5$ or $TeO_2$ may be employed in place of the $SiO_2$ film. Any of these films can be formed by the plasma CVD method, ECR plasma CVD method or sputtering. A metal of Au, Pt or Cr may be deposited instead of Al so as to provide electrical conduction between the resultant film and the radiation screening member.

Further, the direction in which the radiation is incident upon the semiconductor radiation sensor or the semiconductor radiation sensor array can be limited by selecting the thickness of the radiation screening member and the area or width of each of the openings. In this way, the radiation screening member may serve as a collimator or grid which is to be described later.

Figure 9A:
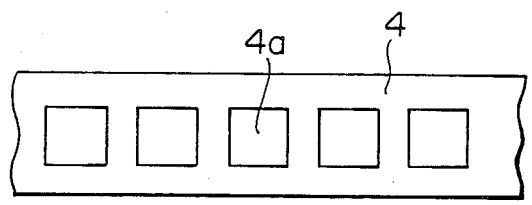
FIGS. 9a and 9b show the screening plate employed in the semiconductor radiation sensor.
Figure 9B:
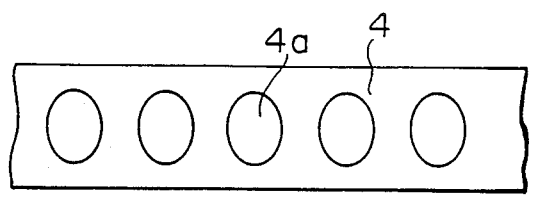
Figure 10:
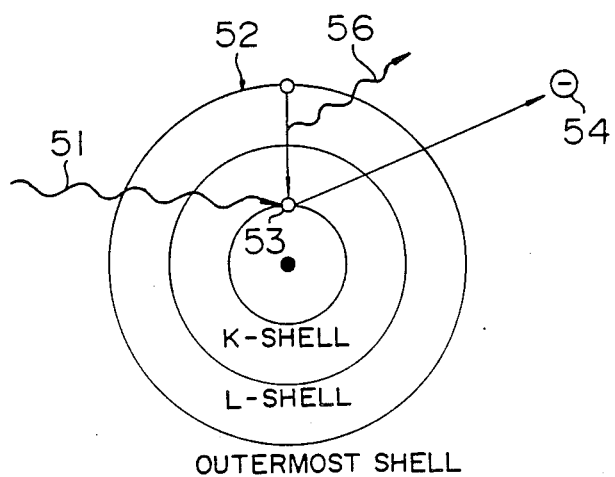
FIG. 10 shows the principle of K-shell photoelectric absorption.
Figure 11:
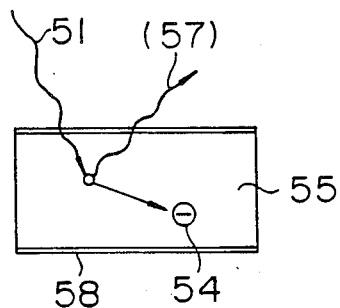
FIG. 11 shows the principle of a semiconductor radiation sensor.
Figure 12A:
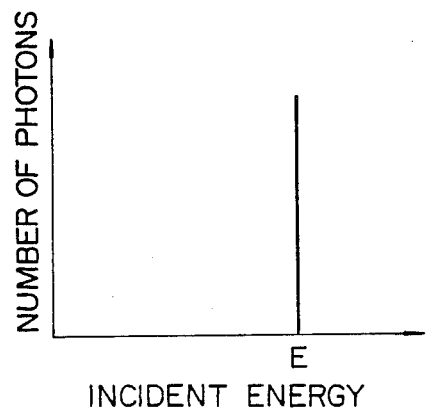
FIGS. 12a and 12b show the pulse height distribution of height of pulses output from a radiation sensor when it receives one-component energy.
Figure 12B:
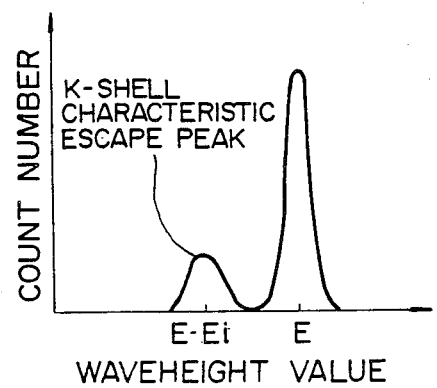

The radiation screening member may have either square openings 4a or circular openings 4a, as shown in FIGS. 9a and 9b, respectively. It is made of tungsten in this embodiment. However, it may also be made of lead, gold or platinum, which have a large atomic numbers. The higher the atomic number, the better.

Any of the above-described embodiments employs a radiation sensor array. However, the present invention can be applied to a one-component radiation sensor. The smaller the size of the one-component radiation sensor, the more advantageous the present invention becomes.

In any of the embodiments, only the X-rays which are characteristic to the K-shell are considered. This is because the X-rays which are characteristic to an outer shell such as L or M and are generated by the photoelectric effect have so small an energy that they do not cause a noticeable degree of X-ray escape.

Silicon (Si), germanium (Ge), gallium arsenide (GaAs), or mercury iodide (HgI) may also be employed as a semiconductor material of a semiconductor radiation sensor.

The K-shell characterized X-ray photon energy is substantially equal to the K absorption edge energy, and has a following value which differs in accordance with the type of material.

As is clear from the foregoing description, in the present invention, a radiation screening member is attached to a radiation sensor. In consequence, a large part of the X-rays generated due to the material of the radiation sensor can be absorbed within the radiation sensor, and the peak of pulses generated by the X-ray escape can be thereby reduced. As a result, the energy resolution of the radiation sensor can be increased, and cross talk that occurs between adjacent sensors in the radiation sensor array can be decreased.

The present invention is very advantageous when it is applied to a very small radiation sensor. It enables a very small radiation sensor to exhibit an energy resolution needed for providing the energy spectrum of an incident radiation which would not be obtained in the prior art. In particular, the present invention enables a provision of a very small radiation sensor array which has an excellent energy resolution power and a high spatial resolution power achieved by decreasing the cross talk.

Further, in the present invention, the electrodes of the semiconductor radiation sensor or the semiconductor radiation sensor array are easily, with a high degree of accuracy, aligned with the openings of the radiation screening member, and damages that occur to the semiconductor radiation sensor when it is connected to an external circuit during manufacture can be eliminated.

What is claimed is:

1. A radiation detector comprising a radiation screening member for intercepting radiation incident upon a marginal portion of the radiation incident surface of a semiconductor radiation sensor or marginal portions of semiconductor radiation sensors in an array and boundary portions between adjacent sensors in said array, said sensor or said sensors in said array being adapted to output pulses in correspondence with radiation photons, said sensor or said sensors in said array having an effective sensing area, and said radiation screening member having an opening area which is smaller than said effective sensing area.

2. The radiation detector of claim 1, wherein at least part of the radiation screening member is closely fitted to the semiconductor radiation sensor or the semiconductor radiation sensor array so as to electrically connect the electrodes of said semiconductor radiation sensor or said semiconductor radiation sensor array with said radiation screening member.

3. A radiation detector according to claim 2, wherein radiation output signals from said semiconductor radiation sensor or said semiconductor radiation sensor array are taken out through said radiation screening member electrically connected to said semiconductor radiation sensor or said semiconductor radiation sensor array.

4. A radiation detector according to claim 3, wherein said radiation screening member limits the direction in which radiation is incident upon said semiconductor radiation sensor or said semiconductor radiation sensor array.

5. A radiation detector according to claim 2, wherein a voltage is applied to said semiconductor radiation sensor or said semiconductor radiation sensor array through said radiation screening member electrically connected to said semiconductor radiation sensor or said semiconductor radiation sensor array.

6. A radiation detector according to claim 5, wherein said radiation screening member limits the direction in which radiation is incident upon said semiconductor radiation sensor or said semiconductor radiation sensor array.

7. A radiation detector according to claim 2, wherein said radiation screening member limits the direction in which radiation is incident upon said semiconductor radiation sensor or said semiconductor radiation sensor array.

8. A radiation detector according to wherein said radiation screening member limits the direction in which radiation is incident upon said semiconductor radiation sensor or said semiconductor radiation sensor array.

9. A radiation detector according to claim 1, wherein the semiconductor material of said semiconductor radiation sensor or said semiconductor radiation sensor array is either silicon (Si), germanium (Ge), gallium arsenide (GaAs), cadmium telluride (CdTe) or mercury iodide (HgI).

10. A method of manufacturing a radiation detector comprising the steps of: providing leads which lead to an external circuit by way of wire bonding, soldering or bump contacting on a radiation screening member for intercepting radiation incident upon the marginal portions of the radiation incident surface of a semiconductor radiation sensor or a semiconductor radiation sensor array and the boundary portions between adjacent sensors, and then fitting at least part of said radiation screening member to said semiconductor radiation sensor or said semiconductor radiation sensor array so as to enable the electrodes of said semiconductor radiation sensor or said semiconductor radiation sensor array to be electrically connected to said radiation screening member.

11. A radiation detector for detecting radiation incident thereon, comprising
a radiation semiconductor sensor having first and second opposite surfaces;
first and second electrodes affixed to the first and second surfaces of said sensor, said first electrode including a plurality of electrode segments each having a predetermined area; and
a screening member, interposed between said incident radiation and said first electrode, having apertures therein, each of said apertures being aligned with a corresponding electrode segment and having an area which is less than the area of its corresponding electrode segment, said screening member being made of a material absorbent to said incident radiation and having a spacing 2x between adjacent apertures which satisfies the equation.
where
I is the intensity of the radiation transmitted through said radiation sensor,
$I_o$ is the intensity of the radiation incident on said sensor and
$\mu(E)$ is the coefficient of photoelectric absorption.

12. The radiation detector of claim 11, wherein said screening member is closely fitted to said first electrode and is made of electrically conductive material on the surface facing said incident radiation and comprises a conductive volume surrounding the respective apertures, said screen member having a lead electrically connected to the surface thereof facing the incident radiation adjacent to each of said apertures, the surface of said screening member facing the first electrode being an electrical insulator located in all areas except those defined by the conductive volume surrounding said apertures, whereby the respective leads on the surface of said screening member are electrically connected with the first electrode.

13. The radiation detector of claim 12, wherein said radiation screening member further comprises a second insulator located between adjacent apertures thereof, whereby the leads on said screening member are electrically insulated from each other.

14. The radiation detector of claim 11, which further comprises an insulator film deposited on the surface of said first electrode and a conductor film is deposited on said insulator film, said screening member being made of electrically conductive material surrounding said aperture, and being provided with a lead electrically connected thereto at each aperture.

15. The radiation detector of claim 14, wherein said screening member further has insulation midway between adjacent apertures.

16. The radiator detector of claim 11, wherein said incident radiation is X-ray radiation and said radiation semiconductor sensor is a X-ray sensor.

* * * * *